United States Patent [19]
Paoli

[11] Patent Number: 5,402,436
[45] Date of Patent: Mar. 28, 1995

[54] NONMONOLITHIC ARRAY STRUCTURE OF MULTIPLE BEAM DIODE LASERS

[75] Inventor: Thomas L. Paoli, Los Altos, Calif.

[73] Assignee: Xerox Corporation, Stamford, Conn.

[21] Appl. No.: 174,914

[22] Filed: Dec. 29, 1993

[51] Int. Cl.$^6$ ............................................. H01S 3/19
[52] U.S. Cl. .................................... 372/50; 372/23; 372/24; 372/36; 372/97; 372/1.1; 347/238
[58] Field of Search .............. 372/50, 23, 24, 36, 372/97; 346/1.1, 108

[56] References Cited

U.S. PATENT DOCUMENTS

| | | | |
|---|---|---|---|
| 4,253,102 | 2/1981 | Kataoka et al. | 346/108 |
| 4,870,652 | 9/1989 | Thornton | 372/50 |
| 4,901,325 | 2/1990 | Kato et al. | 372/44 |
| 5,243,359 | 9/1993 | Fisli | 346/1.1 |
| 5,305,344 | 4/1994 | Patel | 372/50 |
| 5,325,381 | 6/1994 | Paoli | 372/24 |

FOREIGN PATENT DOCUMENTS 0180509  7/1989  Japan .................................. 372/24

Primary Examiner—Georgia Y. Epps
Attorney, Agent, or Firm—Oliff & Berridge

[57] ABSTRACT

A single semiconductor diode laser array with multiple laser beams is used in a laser printer. The single diode laser array is formed by joining two semiconductor diode lasers. Each diode laser emits multiple laser beams that can have a different wavelength than the multiple laser beams of the other diode laser. The diode lasers can be made from different materials, such as GaAs/AlGaAs and GaInP/AlGaInP. The polarization of one diode laser can be orthogonal to the polarization of the other diode laser. The first diode laser has the dimensions of a long width and a short length. The second diode laser has the dimensions of a short width and a long length. The lasing elements are formed centrally to the width of each diode laser. The diode lasers are mounted on separate heatsink mounts. When the diode laser array is assembled, an insulator separates the lasing elements of each diode laser. Contact wires are attached to bonding pads located near the exposed ends or sides of each diode laser.

51 Claims, 5 Drawing Sheets

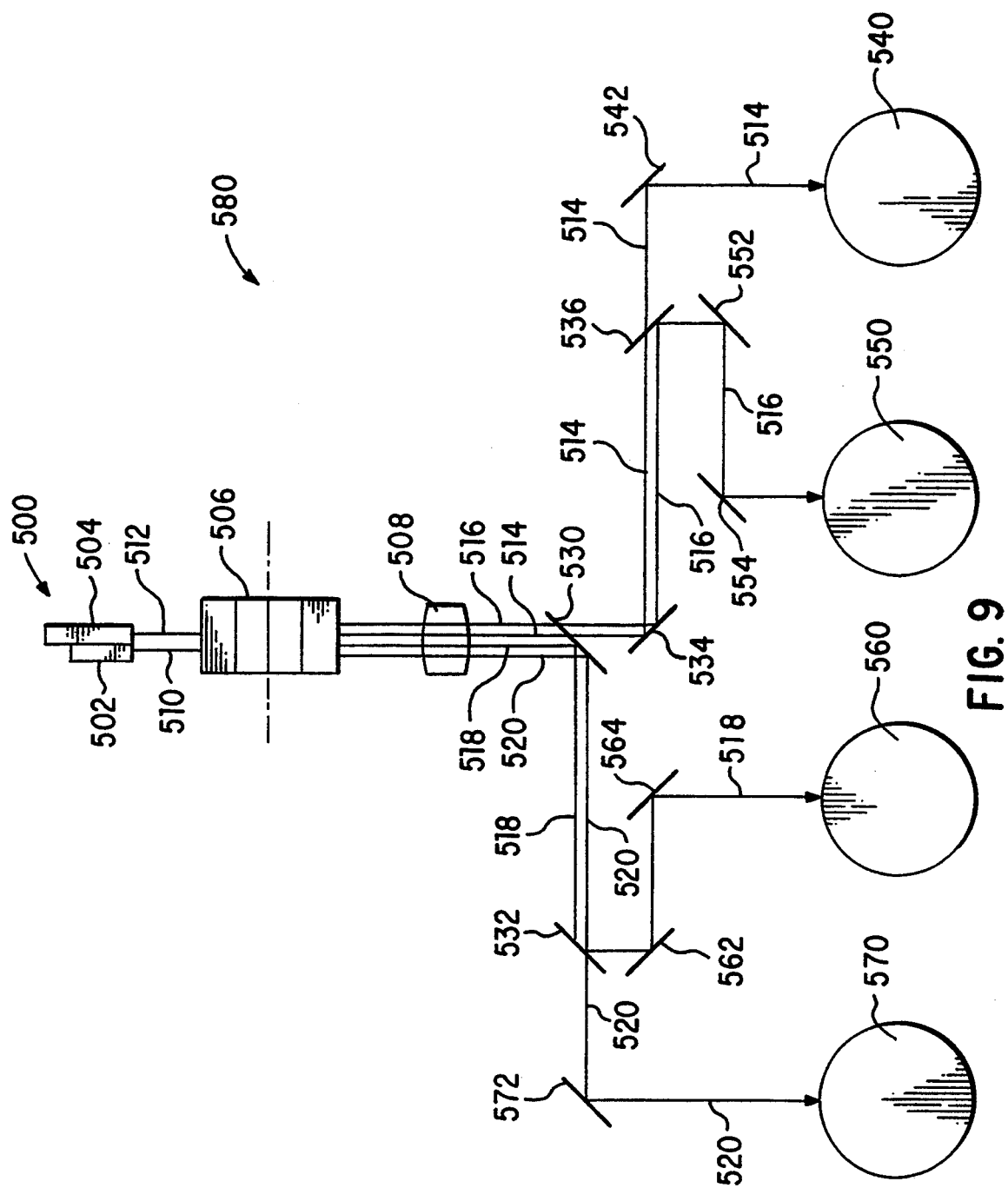

NONMONOLITHIC ARRAY STRUCTURE OF MULTIPLE BEAM DIODE LASERS

BACKGROUND OF THE INVENTION

1. Field of the Invention

This invention relates to improvements in multiple beam diode laser structures. More particularly, this invention joins two multiple beam semiconductor diode lasers into a single array for use in a laser printer.

2. Description of the Related Art

In xerographic printing, one method of forming a latent image on a photoreceptor is by raster sweeping a modulated laser beam across the charged photoreceptor. The latent image is then used to create a permanent image by transferring and fusing toner that was electrostatically attracted to the latent image onto a recording medium, usually plain paper.

While xerographic printing has been successful, problems arise as printing speed increases and it becomes more difficult to scan the laser beam across the photoreceptor at the required speed. Scanning is commonly achieved by deflecting the laser beam from a rotating mirror. Such scanners are referred to as Raster Output Scanners (ROS). With ROSs, one way to scan the laser beam faster is by increasing the rotation speed of the mirror. However, extremely fast mirror rotation requires an expensive drive motor and an increasingly more powerful laser. A second method is to increase the raster sweep speed by using a multifaceted, rotating polygon mirror and a related set of optics. A third method is to sweep several laser beams simultaneously. These scanners are referred to as multiple beam ROSs and are a preferred method to achieve high speed scanning in printers.

Printers using multiple beam ROSs are illustrated in U.S. Pat. No. 4,253,102 to Kataoka, the disclosure of which is incorporated herein by reference. In such printers, the ROS uses a reflective multifaceted polygon mirror that is rotated about its central axis to repeatedly sweep one or more intensity modulated beams of light across a photosensitive recording medium in a line scanning direction (also known as the fast-scan direction.) The recording medium is advanced in an orthogonal, or "process", direction (also known as the slow-scan direction) such that the beams scan the recording medium in accordance with a raster scanning pattern. Digital printing is performed by serially intensity modulating each of the beams in accordance with a binary sample stream, whereby the recording medium is exposed to the image represented by the samples as it is being scanned.

Lasers arranged in the cross-scan direction must be fabricated such that they are spaced closely together in a direction parallel to the polygon mirror rotation axis to enable high density line printing. Such close spacing eliminates the need for inclining the laser array to reduce the distance among individual laser emitters as taught in the Kataoka patent. However, it is also desirable to maintain closely spaced lasing emitters so that the light beams strike as nearly the same portion of the polygon mirror as is possible and deviations in beam characteristics, e.g. spot size, energy uniformity, bow and linearity, due to off axis source positions are minimized.

The raster sweep rate problem becomes even more apparent when printing in color at high speeds. A color xerographic printer requires a separate image for each color printed. A full color printer typically requires four images, one for each of the three primary colors of cyan, magenta, yellow, and an additional one for black. Color prints are currently produced by sequentially transferring and fusing overlapped colors onto a single recording medium that is passed multiple times, once for each color, through the printer. Such printers are referred to as multipass printers.

If each color is associated with a separate photoreceptor, the printer is referred to as a multistation printer. In these printers, high speed color xerographic image output terminals require multiple independently addressable raster lines to be printed simultaneously at separate locations. Usually four independent ROSs are required. If the stations use different positions on the same photoreceptor, the printer is referred to as a single station/multiposition printer.

Multistation and single station/multiposition printers are preferred because they have greater printed page output than a multipass printer operating at the same raster sweep speed. However, problems with these systems include the high cost related to the use of multiple ROSs, the high cost of producing nearly identical multiple ROSs and the difficulty of registering (overlapping) color images on the photoreceptor. Therefore, a printer with a single ROS and a multiple diode laser array is preferable.

U.S. Pat. No. 5,243,359 by Fisli, which is incorporated herein by reference, discloses one way to construct a ROS system enabling deflection of multiple laser beams with a single ROS in a multistation printer. The rotating polygon mirror simultaneously deflects a plurality of clustered, dissimilar wavelength laser beams having a common optical axis and substantially common origin. The clustered beams are subsequently separated by a plurality of optical filters and are directed onto associated photoreceptors of a multistation printer. Similarly dimensioned spots are obtained on each photoreceptor by establishing similar path lengths for each beam. This is facilitated by locating all lasers in one integral unit.

However, economically feasible optical filters require the dissimilar beams to be separated by a sufficiently large wavelength. Typically a wavelength difference of about 50 nm is required. For example, U.S. Pat. No. 5,243,359 utilizes lasers emitting at 645, 695, 755, and 825 nm. Since laser emission from closely spaced monolithic laser sources over this wavelength span is not available, practical systems need to integrate a separate multiple beam diode laser for each wavelength required.

U.S. Patent Application Ser. No. 07/948,531, now U.S. Pat. No. 5,343,224, to Thomas L. Paoli, which is incorporated herein by reference, discloses an alternative multistation printer apparatus employing deflection of multiple laser beams with a single ROS. A single rotating polygon mirror simultaneously deflects a plurality of orthogonally polarized and dissimilar wavelength laser beams. The orthogonally polarized beams are subsequently separated by a polarized beam separator and a plurality of dichroic beam separators. The separated beams are directed onto their associated photoreceptors. Similarly dimensioned spots are obtained on each photoreceptor by establishing similar path lengths for each beam. This is facilitated by locating all lasers in one integral unit. However, such a system requires the dissimilar beams to be separated by a sufficiently large wavelength difference and to emit beams that are orthogonally polarized. For example, U.S. Patent Application Ser. No. 07/948,531, now U.S. Pat. No. 5,343,224, utilizes lasers emitting at 600 and 650 nm that are orthogonally polarized. Monolithic laser sources emitting cross-polarized laser beams at substantially the same wavelength are described in U.S. Patent Application Ser. No. 07/948,524. However, since laser emissions from closely spaced monolithic laser sources emitting cross-polarized beams at wavelengths separated by 50 nm are not available, practical systems need to integrate a separate multiple beam diode laser for each wavelength required.

Accordingly, there is a need for an integrated diode laser array assembly that produces multiple, nearly coaxial laser beams emitted from closely spaced lasing elements having substantially different optical wavelengths and/or orthogonal polarizations. Furthermore, nonmonolithic laser arrays can assemble lasers with different wavelengths to match photoreceptor response windows in color printing systems. The individual lasing elements must be independently controlled without introducing crosstalk between adjacent lasing elements. The diode laser array, which is used with a single set of optics, should produce similarly dimensioned spots that are readily brought into registration.

A nonmonolithic laser array usually consists of a plurality of individual diode lasers mounted on a support. In applications such as laser printing, the output laser beams must be accurately spatially separated. Thus, the diode lasers of the nonmonolithic array must be supported such that accurate positioning of the lasing elements is achieved.

One approach to obtaining arrays of multiple wavelength and/or cross-polarized lasers is disclosed in U.S. Patent Application Ser. No. 08/156,227, wherein the composite array is comprised of separate single beam diode lasers attached to a common support. The support may be formed in the shape of a cross which protrudes from a base. Separate diode lasers are mounted adjacent to each inner corner of the cross. The thickness of the spacer controls the separation of lasing elements on opposite sides of the spacer. The bar of the cross controls the separation of lasing elements on the same side of the spacer. Due to practical limitations on the minimum thickness of the spacer and the bar, lasing elements mounted in this way are typically separated by 150 μm, and therefore, the lasing elements are not optimally close for printing purposes. In addition, the light emitting regions of each laser chip are beneficially mounted against the spacer, thereby precluding assembly of an array of monolithic multiple beam diode lasers for which each lasing element is separately addressable.

An approach which enables assembly of an array of monolithic multiple beam diode lasers with individually addressable lasing elements is disclosed in U.S. Patent Application Ser. No. 08/096,312, now U.S. Pat. No. 5,311,536. This invention provides for nonmonolithic arrays comprised of separate multiple beam diode lasers mounted on protrusions of protruding members of a stacked support. Each diode laser can comprise multiple lasing elements that are monolithically formed in a single chip. The stacked support is implemented such that a separate conductive path is provided on each protruding member for each lasing element, thereby enabling each lasing element to be separately addressed. The protruding members are separated by spacers. However due to practical limitations on the minimum thickness of the spacer that can be used, lasing elements mounted in this way are typically separated by about 150 μm, and therefore, the lasing elements are not optimally close for printing purposes.

An approach which enables assembly of separate but closely spaced lasing elements is described in U.S. Pat. No. 4,901,325 to Kato et al., which is incorporated herein by reference. FIG. 5 shows a semiconductor laser device 400 with two stacked diode lasers 402 and 404. The electrode surfaces of the diode lasers are joined together and connected to wire 412. A bottom electrode surface of diode laser 404 is soldered with a metallized surface 406 on the upper surface of mount 408. Wires 410, 412 and 414 are used to operate the semiconductor laser device 400. Although the lasing elements can be placed within 10 μm of each other in this assembly, joining the electrode surfaces of each diode laser prevents use of this approach for assembling two separate monolithic arrays of multiple beam diode lasers for which each lasing element is separately addressable.

Another approach, which is disclosed in U.S. Pat. No. 4,901,325 by Kato et al., is shown in FIG. 6. Semiconductor diode lasers 426 and 428 are mounted on mounts 422 and 424, respectively. The semiconductor diode lasers are joined through an insulating layer 430. The insulating layer 430 is made of an electrically insulating material having a low thermal conductivity. Further, the active regions of the diode lasers are displaced from each other. In this way, wires 434 and 432 for electrical wiring can be bonded on one side of the chip. Although the lasing emitters can be vertically placed within 10 μm of each other in this assembly, they are displaced horizontally by about 50 μm. This horizontal displacement is undesirable in many applications and precludes use of this approach for assembling monolithic arrays of multiple laser emitters for which each lasing emitter is separately addressable.

In yet another approach disclosed by Kato, et al. (U.S. Pat. No. 4,901,325), an assembly of multiple separate diode lasers, each of which contains a single lasing element, is disclosed. In this approach, the diode lasers 426 and 428 are mounted side by side along either of two planar supports 422 and 424. The two supports are then brought close together as shown in FIG. 7 and attached to the base 440 without touching. Electrical connections are made separately to each diode laser. Although the inventors claim that the distance between two lasing elements on opposite supports can be as small as 10 μm, lasing elements on the same support are separated by at least the width of an individual chip, e.g. 100 μm or more. This separation is undesirable in many applications and precludes use of this approach for assembling arrays of lasing elements closely spaced in two dimensions.

Accordingly, all of the nonmonolithic diode laser arrays disclosed in the prior art suffer from at least one of the following problems. First, alignment of the lasing elements may involve external manipulations and accurate placement of the lasing elements on a support. Second, two supports may have to be placed in close proximity and stably held in position. Third, it may be difficult to achieve closely spaced lasing elements because edge effects or spacers limit the minimum spacing between lasing elements, especially in arrays containing more than two elements.

Thus, a need exists for methods and devices that enables close, accurate spacing of lasing elements in a nonmonolithic laser array without excessive thermal, optical, and/or electrical crosstalk. Such methods and devices are even more desirable if they permit the accurate and stable orientation of the lasing elements.

SUMMARY OF THE INVENTION

It is an object of the invention to combine two multiple beam semiconductor diode lasers into one array that emits several laser beams of different characteristics.

It is a further object of the invention to produce a diode laser array for laser printers that allows for higher printing speeds and better spot acuity than a printer using only a single lasing element.

It is a further object of the invention to provide a diode laser array that has closely spaced multiple wavelength diode lasers to enable a low-cost multistation processor operating with a single polygon mirror and one set of optics.

The invention combines semiconductor diode lasers that are made from different materials. A single semiconductor diode laser can be made from a single set of materials such as GaAs/AlGaAs and GaInP/AlGaInP. Each diode laser can be a monolithic array of multiple lasing elements and thereby produce a plurality of laser beams. Each diode laser can have a different structure optimized for its wavelength and materials. These diode lasers are combined into a single optical source emitting beams with different characteristics.

The shapes of the two semiconductor diode lasers are different. The first diode laser has a long width and a short length. The second diode laser has a short width and a long length. The lasing elements are formed in the central region of the width of each diode laser. The diode lasers are mounted on separate heatsink mounts. When the lasers are assembled into an integrated structure, an insulator separates the contacts for each diode laser. Contact wires are attached to bonding pads located at the exposed surface near the end of one diode laser and the sides of the other.

Before final assembly of the integrated array, the semiconductor diode lasers can be selected for their specific wavelength and polarization characteristics. The wavelength separation obtained by two or more lasers made of different materials is larger than that obtained from any one material system.

BRIEF DESCRIPTION OF THE DRAWINGS

For a better understanding of the invention and further features thereof, reference is made is to the following detailed description of the invention to be read in connection with the accompanying drawings, wherein:

FIG. 9 shows a multiple laser station printer using a diode array according to the third embodiment.

DETAILED DESCRIPTION OF PREFERRED EMBODIMENTS

While this invention has been described in some detail herein, with specific references to illustrated embodiment, it is understood that there is no intent to be limited to that embodiment. On the contrary, the aim is to cover all modifications, alternatives and equivalents falling within the spirit and scope of the invention as defined by the claims.

Figure 1:
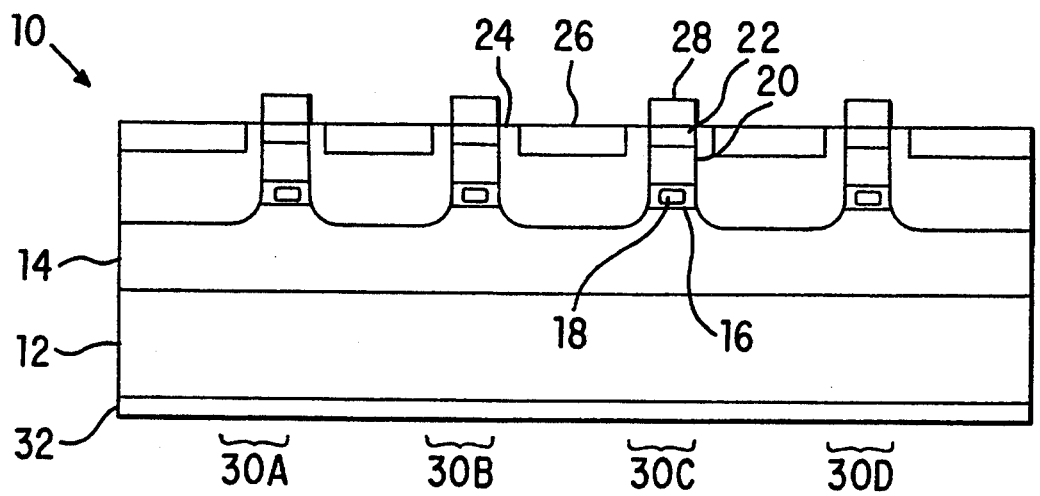
FIG. 1 shows a multiple beam semiconductor diode laser of the prior art used in the first preferred embodiment.

FIG. 1 shows a diode laser of the prior art to illustrate the type of multiple beam diode laser used in the first preferred embodiment. For more detail, refer to U.S. Pat. No. 4,870,652 by Thornton, which is incorporated by reference in its entirety. The monolithic diode laser 10 has four independently addressable lasing elements 30A–30D.

A cladding layer 14 of n-$Ga_{1-x}Al_xAs$ is epitaxially deposited on a substrate 12, which is made of n-GaAs. The active region 16 comprises a relative thin conventional double heterostructure (DH) or quantum well active layer or other similar structure that is undoped, p-type doped or n-type doped. Each active region 16 has a facet emission point 18 from which laser light is emitted. A cladding layer 20 of p-$Ga_{1-x}Al_xAs$ and a cap layer 22 of p+GaAs are deposited over the active region 16. A subsequent p-type zinc diffusion into cap layer 22 enhances the ohmic contact and reduces the series resistance through the lasing elements. The epitaxial deposition may be via MOCVD, which is known in the art. Metal connections 28 are formed over each cap layer 22 to address the semiconductor diode.

To separate each of the active regions 16, an n-type disordered region 24 is formed. Electrically insulating barriers 26 are formed by using a proton bombardment to a depth beyond the zinc diffusion. The proton bombardment between the lasing elements is an important feature to provide a level of electrical isolation between the lasing elements sufficient to permit their independent operation without electrical crosstalk. A metal connection 32 is attached to the bottom of substrate 12 to form a ground connection for each semiconductor diode laser.

The multiple lasing elements of diode laser 10, which are represented by the facet emission points 18, are sufficiently close to one another but are not optically coupled. The four lasing elements are independently addressable in spite of their closely packed density, which assures that the light emissions are focused on an image plane, such as a photoreceptor surface of a printer. Each active region 16 is approximately three microns wide. Each active region in diode laser 10 is separated by approximately 10 $\mu$m. Therefore, the diode laser 10 can print a sufficiently dense group of pixels required for good printing resolution.

Figure 2:
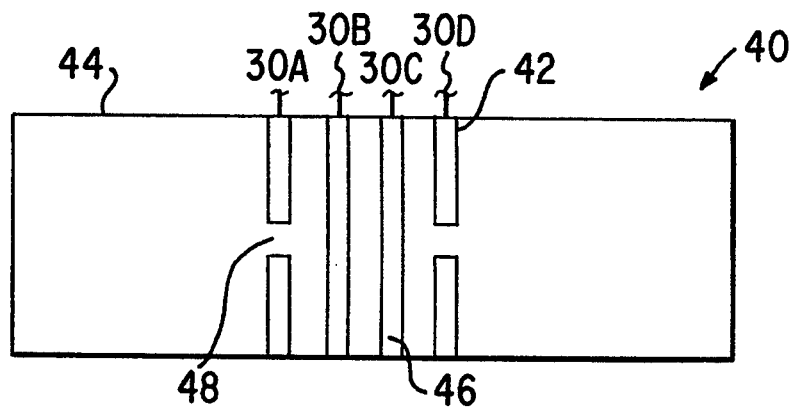
FIG. 2 is a top view of the semiconductor diode laser of the prior art showing the conducting channels of the four lasers.

FIG. 2 is a top plan view of the four beam diode laser of FIG. 1. Each lasing element has an independent electrical contact so that the four different lasing elements are independently addressed. The four different lasing elements are in close spatial relation without incurring undesirable electrical and thermal interaction or crosstalk between the independently addressed lasing elements.

Referring to FIG. 2, each lasing element 30A–30D is formed by n-type disordered regions 24. A shallow ion or proton implant 44 electrically isolates each lasing element from one another as well as forming a platform for fabricating four independent metal contacts, one for each lasing element. Implanted regions 46 extend through the parasitic junction region formed by the p-type (Zn) diffusion of the cap layer 22. Implant crossover regions 48, which have a small width, are formed across the edge elements in order to make these regions highly resistive for cross-over contact connection of the central two lasing elements.

Figure 3:
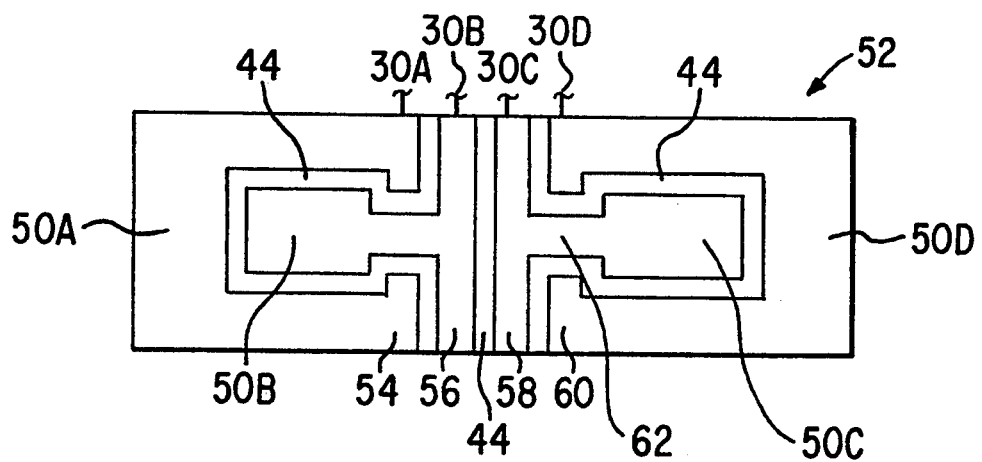
FIG. 3 is a top view of the semiconductor diode laser showing the pattern for bonding pads of the prior art.

FIG. 3 shows a metallization pattern 52, which is formed over the proton implant pattern 44 of FIG. 2. The metallization pattern 52 is formed from a Cr-Au bilayer. Channels 54, 56, 58 and 60 are formed over lasing elements 30A-30D of FIG. 2. Four bonding pads 50A-50D, which are comprised of metal, are connected to respective active regions of lasing elements 30A-30D. The outer bonding pads 50A and 50D are connected to bifurcated stripes 54 and 60. The inner bonding pads 50B and 50C are connected to contact stripes 56 and 58 via the metal connection bridge 62. The exposed proton implants 44 electrically separate the metal connections.

The disadvantage of the semiconductor diode laser in FIG. 1 is that the wavelength of each lasing element is the same. Therefore, a nonmonolithic multiple wavelength structure cannot be manufactured by the above design.

Figure 4:
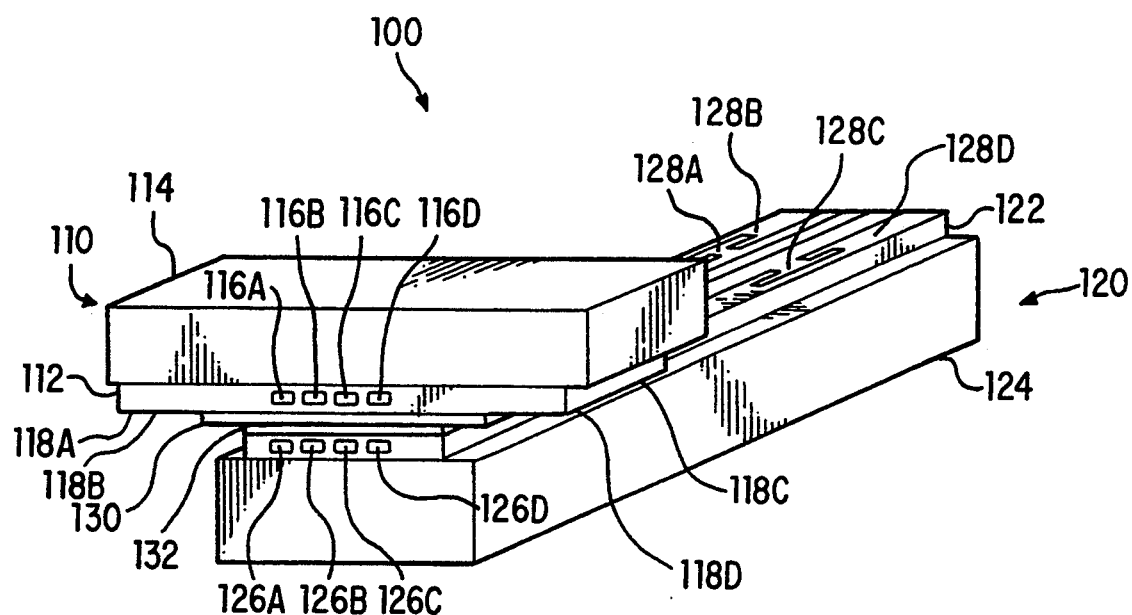
FIG. 4 shows a diode laser array according to the first preferred embodiment.
Figure 5:
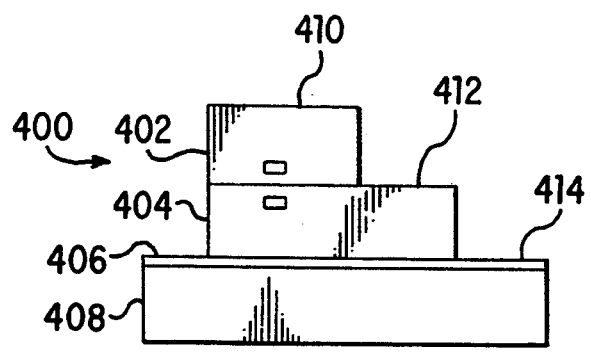
FIG. 5 shows a laser printer using a diode laser array according to the second preferred embodiment.
Figure 6:
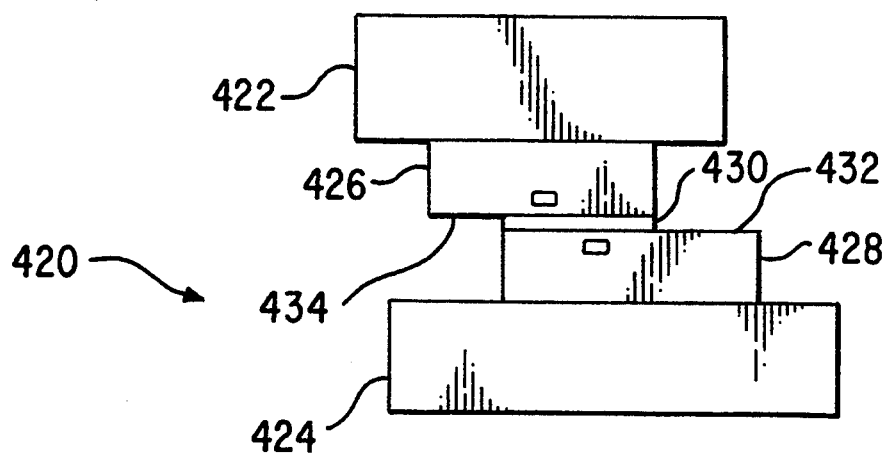
FIG. 6 shows two semiconductor diode lasers mounted to form a single laser array in the prior art.
Figure 7:
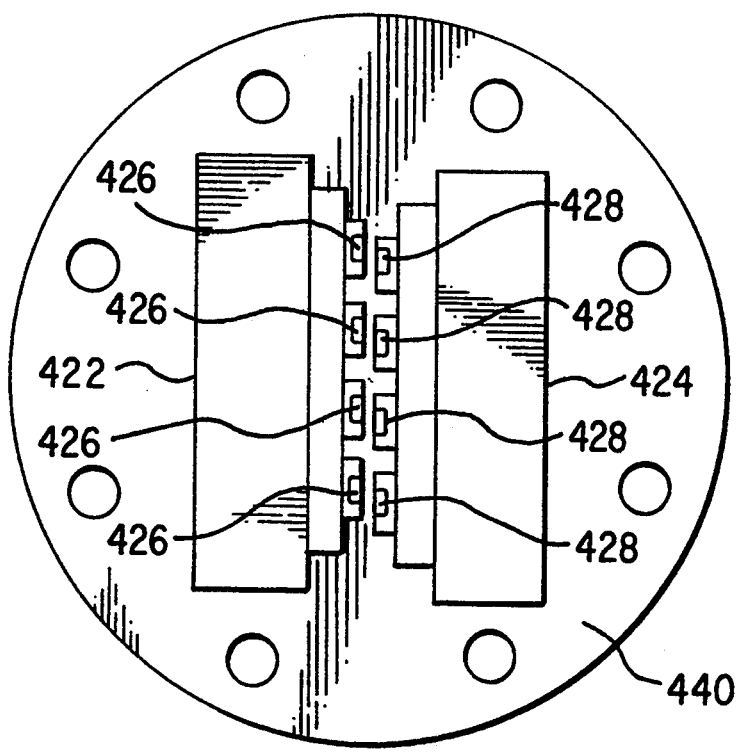
FIG. 7 shows semiconductor diode lasers mounted to form another single laser array in the prior art.

FIG. 4 shows a nonmonolithic semiconductor diode laser array of the first preferred embodiment. The diode lasers are made from different materials, e.g. GaAs/AlGaAs and GaInP/AlGaInP, and combined into a single optical source emitting multiple wavelengths. Each diode laser can have a different structure optimized for its wavelength and material. The wavelength separation between diode lasers can be preselected and accurately controlled by selecting each diode laser before final assembly. A low-cost multistation or multiposition processor can use these optical sources with only a single polygon mirror and one set of optics.

FIG. 4 shows a multiple diode laser array 100 assembled according to the first preferred embodiment. A top diode laser 110 has four separately addressable lasing elements monolithically fabricated in single chip 112 mounted on a top mount 114. The top mount 114, which is for example a silicon heatsink mounted on adjustable block, provides a common ground return for all four lasing elements in chip 112. Its four facet emission points 116A-116D are shown. The bottom diode laser 120 has a four separately addressable lasing elements monolithically fabricated in a single chip 122 mounted on a bottom mount 124. Its facet emission points 126A-126D are shown.

The bottom laser chip 120 and the top laser chip 110 are separated by insulator strips 130 and 132, which are formed, for example, from polyimide. The insulator strips provide electrical insulation and a cushion between the diode lasers. The lasing elements of each diode laser can be as close as 10 μm.

By combining a wide, short diode laser 110 with a narrow, long diode laser 120, the multiple bonding pads on each diode laser chip can be easily accessed. For example, the bottom laser chip is 250 microns wide by 500 microns long. The top laser chip is 500 microns wide by 250 microns long. Wires 128A-128D are attached to bonding pads located at the rear half of the bottom laser chip 120. These wires control the operation of lasing elements 126A-126D, respectively. Wires 118A-118D are attached to bonding pads located at the sides of top laser chip 110. These wires control the operation of lasing elements 116A-116D, respectively.

The first preferred embodiment forms a single laser array emitting eight laser beams. Two separate wavelengths can be obtained by assembling one diode laser containing four lasing elements having a different wavelength than the four lasing elements on the second diode laser. A single laser array emitting more than eight laser beams can be obtained in the same way by selecting two diode lasers containing more than four lasing elements each.

During assembly of the integrated package, positioning in the horizontal direction (±1 micron) is set by adjusting the position of one mount relative to the other until the facet emission points are aligned as observed with a microscope. Positioning in the vertical direction is set by the thickness of the insulator. Positioning in the axial direction is set by adjusting the position of one diode laser to align its edge with the edge of the other diode laser.

A second preferred embodiment also forms a single laser array emitting eight laser beams similar to the first preferred embodiment. For this embodiment the diode lasers are made to emit orthogonally polarized beams with substantially the same wavelength. Assembly is accomplished as described previously.

The laser array of either embodiment can be used to make a single station/multiposition printer as disclosed in U.S. Patent Application Ser. No. 07/948,531, now U.S. Pat. No. 5,343,224, and shown in FIG. 8. For example, diode laser array 200 has top diode laser 210, which emits four polarized laser beams 250. Bottom diode laser array 220 emits four polarized laser beams 240, which are orthogonally polarized to laser beams 250. All laser beams have substantially the same wavelength. The eight laser beams are projected through an input optical system 312 which serves to direct all laser beams onto overlapping coaxial optical paths such that they illuminate a rotating polygon 314 having a plurality of facets. The rotating polygon repeatedly and simultaneously deflects the laser beams along the fast scan direction. The deflected laser beams are input to a single set of imaging and correction optics 310, which focuses the laser beams and corrects for errors such as polygon angle error and wobble. The optics 310 projects the laser beams toward a polarized beam separator 320, which separates the beams of one polarization from the beams of the other polarization. Mirrors 336 and 338 direct deflected laser beams 250 onto the photoreceptor 340. Mirrors 330, 332, and 334 direct the laser beams 240 onto a separate region of the photoreceptor 340.

Figure 8:
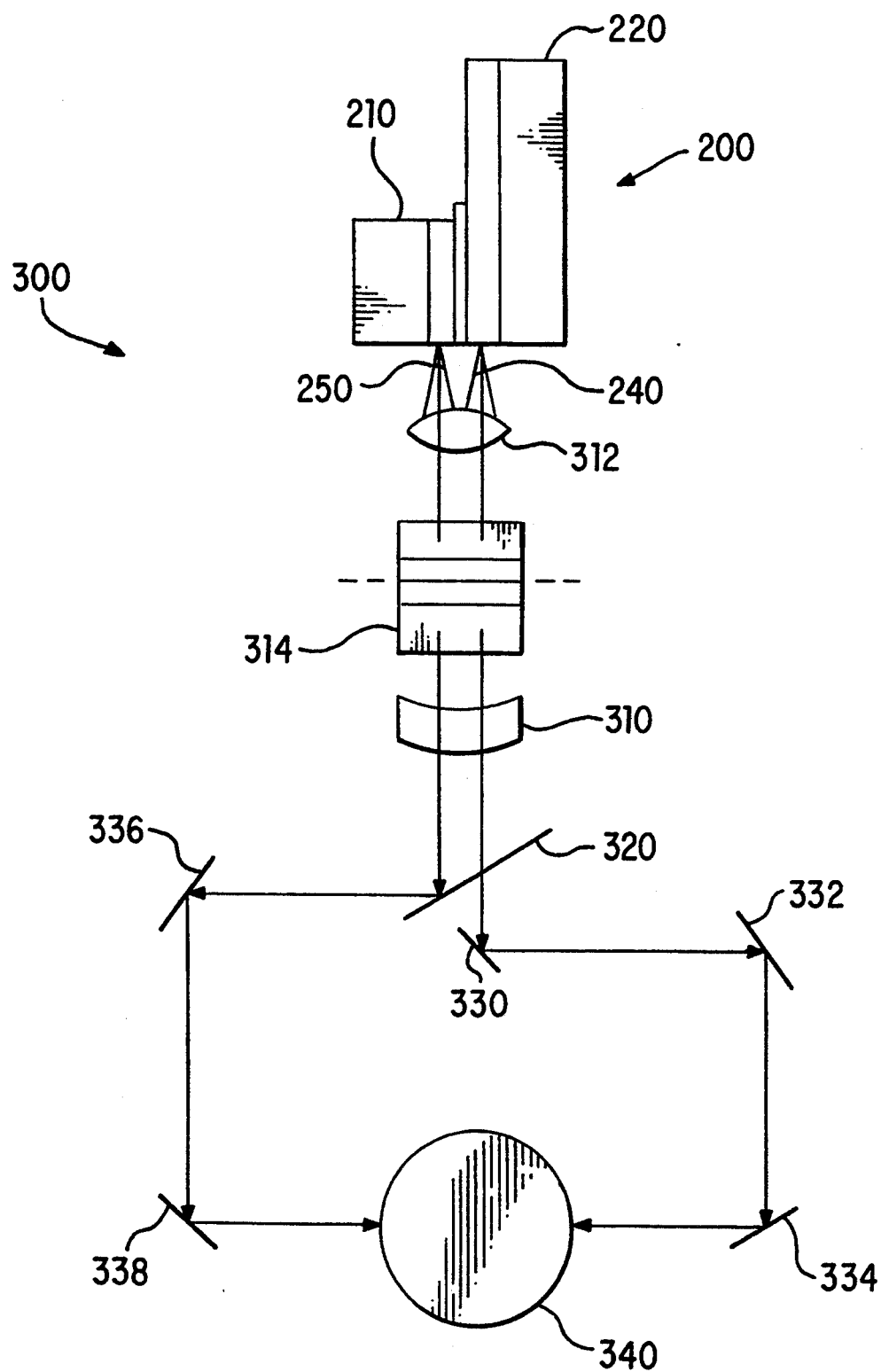
FIG. 8 shows a laser printer using a diode laser array according to the third preferred embodiment.

A similar laser printer can be made using a diode laser array 200 comprising a top diode laser 210, which emits four laser beams 250 at a first wavelength and a bottom diode laser 220, which emits four laser beams 240 at a second wavelength. The laser beams can have any polarization direction. The printer is set up as shown in FIG. 8 except that separator 320 is a dichroic separator which reflects beams of the first wavelength and transmits beams of the second wavelength. Dichroic separators of this kind are well known in the art.

A third preferred embodiment of the present invention forms a single laser array emitting multiple laser beams at two wavelengths and two polarizations. For this embodiment each diode laser can, for example, be constructed as disclosed in U.S. Patent Application Ser. No. 07/948,524 to contain separate lasing elements, which emit orthogonally polarized beams at substantially the same wavelength. Thus a diode laser array can be made according to the present invention by assembling a first diode laser which emits orthogonally polarized laser beams at a first wavelength and a second diode laser which emits orthogonally polarized laser beams at a second wavelength. Assembly is accomplished as described previously.

The laser array of the third embodiment can be used to make a multiple station printer 580 as disclosed in U.S. Patent Application Ser. No. 07/948,531, now U.S. Pat. No. 5,343,224, and shown in FIG. 9. For example, diode laser array 500 has top diode laser 502, which emits eight laser beams 510. Four of the laser beams are orthogonally polarized to the other four laser beams. All eight laser beams have a first wavelength. Bottom diode laser 504 emits eight laser beams 512. Four of the laser beams are polarized parallel to one polarization present in beams 510 and the other four beams in 512 are polarized parallel to the other polarization present in beams 510. All eight laser beams 512 have a second wavelength which is different from the first wavelength of beams 510.

The sixteen laser beams are projected through an input optical system which serves to direct all laser beams onto overlapping coaxial optical paths such that they illuminate a rotating polygon 506 having a plurality of facets. For simplicity, four laser beams are shown. Laser beams 514 and 516 have different wavelengths but the same polarization. Laser beams 518 and 520 also have different wavelengths but the same polarization. The rotating polygon repeatedly and simultaneously deflects the laser beams along the fast scan direction. The deflected laser beams are input to a single set of imaging and correction optics 508, which focuses the laser beams and corrects for errors such as polygon angle error and wobble.

The optics 508 projects the laser beams toward a polarized beam separator 530, which separates the laser beams of one polarization from the beams of the other polarization. Laser beams 518 and 520 are then input to a dichroic beam separator 532, while laser beams 514 and 516 first reflect off mirror 534 and are then input to a dichroic beam separator 536. The dichroic beam separators 532 and 536 are wavelength selective multiple layer films which reflect beams of a first wavelength and transmit beams of a second wavelength. Thus the dichroic beam separator 532 separates the overlapping beams 518 and 520, while the dichroic beam separator 536 separates the overlapping beams 514 and 516. A mirror 542 then reflects the separated laser beam 514 onto a photoreceptor 540, while mirrors 552 and 554 reflect the separated laser beam 516 onto a photoreceptor 550. Similarly, a mirror 572 reflects the separated laser beam 520 onto a photoreceptor 570, while mirrors 562 and 564 reflect the separated laser beam 518 onto a photoreceptor 560. Since each laser beam is independently modulated with image information, a distinct latent image is simultaneously printed on each photoreceptor. Thus apparatus 580 may be used for full color reproduction, wherein the image on each photoreceptor corresponds to a different system color.

Although the invention has been described and illustrated with particularity, it is intended to illustrate preferred embodiments. It is understood that the disclosure has been made by way of example only. Numerous changes in the combination and arrangements of the parts, steps and features can be made by those skilled in the art without departing from the spirit and scope of the invention, as herein claimed.

What is claimed is:

1. A multiple beam diode laser array comprising:
    a first semiconductor diode laser having a plurality of active regions each emitting a laser beam, the laser beam of each active region having a first predetermined wavelength, and each active region having an electrical connection near an edge of the surface of the first semiconductor diode laser;
    a second semiconductor diode laser having a plurality of active regions each emitting a laser beam, the laser beam of each active region having a second predetermined wavelength, and each active region having an electrical connection near an edge of the surface of the second semiconductor diode laser; and
    an insulator located between the first and second semiconductor diode lasers, the insulator providing electrical insulation and spacing between the first and second semiconductor diode lasers.

2. The multiple beam diode laser array of claim 1, wherein the first and second predetermined wavelengths are different.

3. The multiple beam diode laser array of claim 1, wherein the first and second predetermined wavelengths are the same.

4. The multiple beam diode laser array of claim 1, wherein the first and second semiconductor diode lasers have orthogonally polarized laser beams.

5. The multiple beam diode laser array of claim 1, wherein the first and second semiconductor diode lasers each have separate active regions that emit orthogonally polarized laser beams and the first and second predetermined wavelengths are different.

6. The multiple beam diode laser array of claim 1, wherein the first and second semiconductor diode lasers each have four active regions that emit laser beams having a substantially identical wavelength.

7. The multiple beam diode laser array of claim 1, wherein the centers of the active regions are separated by a distance ranging between 10 and 50 micrometers.

8. The multiple beam diode laser array of claim 1, wherein the insulator is polyimide.

9. The multiple beam diode laser array of claim 1, wherein the insulator determines the separation of the first and second semiconductor diode lasers.

10. The multiple beam diode laser array of claim 1, wherein the first semiconductor diode laser is mounted on a first heatsink substrate and the second semiconductor diode laser is mounted on a second heatsink substrate.

11. The multiple beam diode laser array of claim 10, wherein the heatsink substrates are silicon and provide a ground connection for the semiconductor diode lasers.

12. The multiple beam diode laser array of claim 1, wherein the first semiconductor diode laser has a width larger than the width of the second semiconductor diode laser, and the second semiconductor diode laser has a length longer than the length of the first semiconductor diode laser.

13. The multiple beam diode laser array of claim 12, wherein wire connections to the lasing elements of the first semiconductor diode laser are located at a top surface near each end of the width, and wire connections to the lasing elements of the second semiconductor diode laser are located at a top surface near an end of the length.

14. The multiple beam diode laser array of claim 12, wherein the first semiconductor diode laser is 500 microns wide and 250 microns long, and the second semiconductor diode laser is 250 microns wide and 500 microns long.

15. The multiple beam diode laser array of claim 1, wherein the facet emission points of the first and second semiconductor diode lasers are on edges that are aligned substantially flush.

16. A method of manufacturing a multiple beam diode laser array, comprising the steps of:
    selecting a first semiconductor diode laser having a plurality of active regions, each active region outputting a laser beam having a first predetermined wavelength, and each active region having an electrical connection near an edge of the surface of the first semiconductor diode laser;
    selecting a second semiconductor diode laser having a plurality of active regions, each active region outputting a laser beam having a second predetermined wavelength, and each active region having an electrical connection near an edge of the surface of the second semiconductor diode laser;
    sandwiching an insulator between the first and second semiconductor diode lasers, the diode lasers being mounted so that all of the laser beams are substantially parallel; and
    connecting electrical wires to respective bonding pads located on the first and second semiconductor diode lasers.

17. The method of claim 16, wherein the first semiconductor diode laser is mounted on a first heatsink after the first selection step, and the second semiconductor diode laser is mounted on a second heatsink after the second selection step.

18. The method of claim 16, wherein the second semiconductor diode laser is selected to have orthogonally polarized laser beams relative to the laser beams of the first semiconductor diode laser.

19. The method of claim 16, wherein the second semiconductor diode laser is selected to have substantially the same predetermined wavelength as the first semiconductor diode laser.

20. The method of claim 16, wherein the second semiconductor diode laser is selected to have a different predetermined wavelength as the first semiconductor diode laser.

21. The method of claim 16, wherein the first and second semiconductor diode lasers are each selected to have separate active regions that emit orthogonally polarized laser beams and the first and second predetermined wavelengths are different.

22. The method of claim 16, wherein the centers of the active regions are separated by a distance ranging between 10 and 50 micrometers.

23. The method of claim 16, wherein the insulator is polyimide.

24. The method of claim 16, wherein the first semiconductor diode laser has a width larger than the width of the second semiconductor diode laser and the second semiconductor diode laser has a length longer than the length of the first semiconductor diode laser.

25. The method of claim 24, wherein wire connections to the lasing elements of the first semiconductor diode laser are located at a top surface near each end of the width, and wire connections to the lasing elements of the second semiconductor diode laser are located at a top surface near an end of the length.

26. The method of claim 16, wherein the facet emission points of the first and second semiconductor diode lasers are on edges that are aligned substantially flush.

27. A laser printer comprising:
    photoreceptor means for retaining a charge;
    a multiple beam diode laser array comprising:
        a first semiconductor diode laser having a plurality of active regions each emitting a laser beam, the laser beam of each active region having a first predetermined wavelength, and each active region having an electrical connection near an edge of the surface of the first semiconductor diode laser;
        a second semiconductor diode laser having a plurality of active regions each emitting a laser beam, the laser beam of each active region having a second predetermined wavelength, and each active region having an electrical connection near an edge of the surface of the second semiconductor diode laser; and
        an insulator located between the first and second semiconductor diode lasers, the insulator providing electrical insulation and spacing between the first and second semiconductor diode lasers;
    scanning means for sweeping the laser beams across the photoreceptor in a fast-scan direction;
    a beam separator for separating the laser beams of the first semiconductor diode laser from the laser beams of the second semiconductor diode laser;
    a plurality of mirrors for directing the separated laser beams to the appropriate regions of the photoreceptor means; and
    developing means for developing the electrical charges on the photoreceptor means.

28. The laser printer of claim 27, wherein the first and second predetermined wavelengths are different.

29. The laser printer of claim 27, wherein the first and second predetermined wavelengths are substantially identical.

30. The laser printer of claim 27, wherein the first and second semiconductor diode lasers have orthogonally polarized laser beams.

31. The laser printer of claim 27, wherein the first and second semiconductor diode lasers each have separate active regions that emit orthogonally polarized laser beams and the first and second predetermined wavelengths are different.

32. The laser printer of claim 27, wherein the centers of the active regions are separated by a distance ranging between 10 and 50 micrometers.

33. The laser printer of claim 27, wherein the insulator is polyimide.

34. The laser printer of claim 27, wherein the first semiconductor diode laser is mounted on a first heatsink substrate and the second semiconductor diode laser is mounted on a second heatsink substrate.

35. The laser printer of claim 34, wherein the heatsink substrates are silicon and provide a ground connection for the semiconductor diode lasers.

36. The laser printer of claim 27, wherein the first semiconductor diode laser has a width larger than the width of the second semiconductor diode laser and the second semiconductor diode laser has a length longer than the length of the first semiconductor diode laser.

37. The laser printer of claim 36, wherein wire connections to the lasing elements of the first semiconductor diode laser are located at a top surface near each end of the width, and wire connections to the lasing elements of the second semiconductor diode laser are located at a top surface near an end of the length.

38. The laser printer of claim 36, wherein the first semiconductor diode laser is 500 microns wide and 250 microns long, and the second semiconductor diode laser is 250 microns wide and 500 microns long.

39. The laser printer of claim 27, wherein the first and second semiconductor diode lasers each have four facet emission points and all of the facet emission points are on edges that are aligned substantially flush.

40. A laser printer comprising:
photoreceptor means for retaining a charge;
a multiple beam diode laser array comprising:
  a first semiconductor diode laser having a plurality of active regions each emitting a laser beam, the laser beam of each active region having a first predetermined wavelength, and each active region having an electrical connection near an edge of the surface of the first semiconductor diode laser;
  a second semiconductor diode laser having a plurality of active regions each emitting a laser beam, the laser beam of each active region having a second predetermined wavelength, and each active region having an electrical connection near an edge of the surface of the second semiconductor diode laser; and
  an insulator located between the first and second semiconductor diode lasers, the insulator providing electrical insulation and spacing between the first and second semiconductor diode lasers;
scanning means for sweeping the laser beams across the photoreceptor in a fast-scan direction;
a polarized beam separator for separating the laser beams from the first and second semiconductor diode lasers into a first set and a second set, the first set containing at least one laser beam from the first semiconductor diode laser and at least one laser beam from the second semiconductor diode laser, and the second set containing remaining ones from the first and second semiconductor diode lasers;
a first dichroic beam separator for further separating the laser beams of the first set into a third set and a fourth set, the third set containing at least one laser beam from the first semiconductor diode laser, and the fourth set containing remaining ones of the first set;
a second dichroic beam separator for further separating the laser beams of the second set into a fifth set and a sixth set, the fifth set containing at least one laser beam from the first semiconductor diode laser, and the sixth set containing remaining ones of the second set;
a plurality of mirrors for directing the separated laser beams to the appropriate regions of the photoreceptor means; and
developing means for developing the electrical charges on the photoreceptor means.

41. The laser printer of claim 40, wherein the first and second predetermined wavelengths are different.

42. The laser printer of claim 40, wherein the first and second semiconductor diode lasers have orthogonally polarized laser beams.

43. The laser printer of claim 40, wherein the first and second semiconductor diode lasers each have separate active regions that emit orthogonally polarized laser beams and the first and second predetermined wavelengths are different.

44. The laser printer of claim 40, wherein the centers of the active regions are separated by a distance ranging between 10 and 50 micrometers.

45. The laser printer of claim 40, wherein the insulator is polyimide.

46. The laser printer of claim 40, wherein the first semiconductor diode laser is mounted on a first heatsink substrate and the second semiconductor diode laser is mounted on a second heatsink substrate.

47. The laser printer of claim 46, wherein the heatsink substrates are silicon and provide a ground connection for the semiconductor diode lasers.

48. The laser printer of claim 40, wherein the first semiconductor diode laser has a width larger than the width of the second semiconductor diode laser and the second semiconductor diode laser has a length longer than the length of the first semiconductor diode laser.

49. The laser printer of claim 48, wherein wire connections to the lasing elements of the first semiconductor diode laser are located at a top surface near each end of the width, and wire connections to the lasing elements of the second semiconductor diode laser are located at a top surface near an end of the length.

50. The laser printer of claim 49, wherein the first semiconductor diode laser is 500 microns wide and 250 microns long, and the second semiconductor diode laser is 250 microns wide and 500 microns long.

51. The laser printer of claim 40, wherein the first and second semiconductor diode lasers each have eight facet emission points and all of the facet emission points are on edges that are aligned substantially flush.

* * * * *